United States Patent [19]
Burr et al.

[11] Patent Number: 5,550,779
[45] Date of Patent: Aug. 27, 1996

[54] HOLOGRAPHIC MEMORY WITH ANGLE, SPATIAL AND OUT-OF-PLANE MULTIPLEXING

[75] Inventors: Geofrrey W. Burr, Pasadena; Fai H. Mok, Torrance; Demetri Psaltis, Pasadena, all of Calif.

[73] Assignee: California Institute of Technology, Pasadena, Calif.

[21] Appl. No.: 326,783

[22] Filed: Oct. 20, 1994

[51] Int. Cl.$^6$ .................................................. G11C 7/00
[52] U.S. Cl. .......................... 365/216; 365/124; 365/125; 365/215; 359/3; 359/15
[58] Field of Search ...................... 365/124, 125, 365/215, 216, 235; 359/3, 10, 15

[56] References Cited

U.S. PATENT DOCUMENTS

| | | | |
|---|---|---|---|
| 3,847,465 | 11/1974 | Micheron et al. | 365/125 |
| 3,891,976 | 6/1975 | Carlsen | 365/235 |
| 4,988,153 | 1/1991 | Paek | 365/216 |
| 5,436,867 | 7/1995 | Mok | 365/216 |

*Primary Examiner*—David C. Nelms
*Assistant Examiner*—F. Niranjan
*Attorney, Agent, or Firm*—Michael L. Keller, Esq.; Michaelson & Wallace

[57] ABSTRACT

The invention is embodied in an optical memory having a holographic recording medium capable of storing respective holograms in respective storage spots, the memory including a coherent collimated reference beam and an information-bearing object beam illuminating the recording medium, a segmented optical array including a stack of plural segmented optical sub-arrays, each of the segmented optical sub-arrays including an array of generally parallel optical strips, each optical strip having a strip length extending parallel to the optical strips, respective optical strips of all of the sub-arrays providing an optical path for the reference beam to respective recording spots in the holographic recording medium whenever the reference beam is incident within the strip length, two optical strips in different sub-arrays with optical paths to the same recording spot being separated by at least an out-of-plane multiplexing difference angle subtended by paths of the reference beam to the two optical strips, a reference beam steering apparatus for scanning the reference beam to different locations on the segmented optical array, and a modulator apparatus for modulating the object beam with a succession of input patterns simultaneously with the scanning of the reference beam by the reference beam steering apparatus so as to record a plurality of angle multiplexed and out-of-plane multiplexed holograms in at least one of the recording spots. Each of the sub-arrays corresponds to a different out-of-plane multiplexing angle of the reference beam.

31 Claims, 12 Drawing Sheets

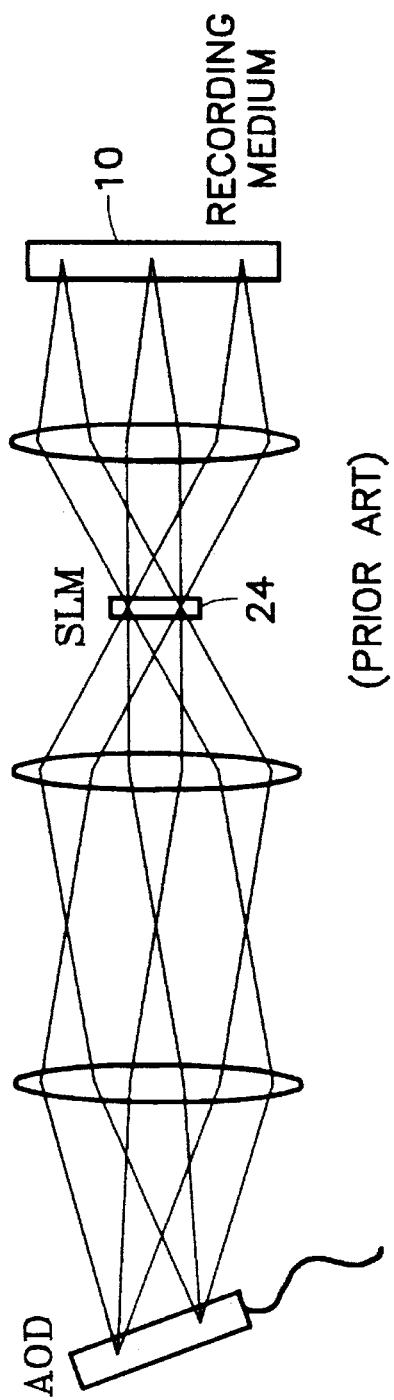
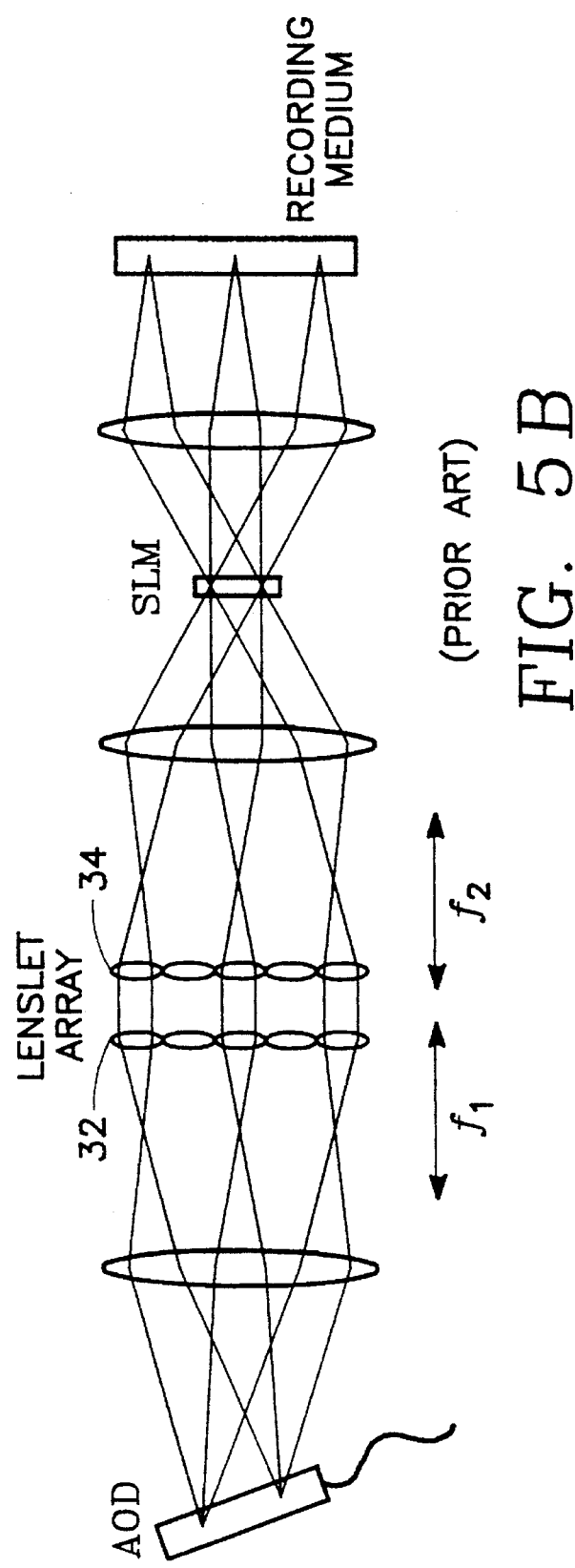
FIG. 5A (PRIOR ART)
FIG. 5B (PRIOR ART)

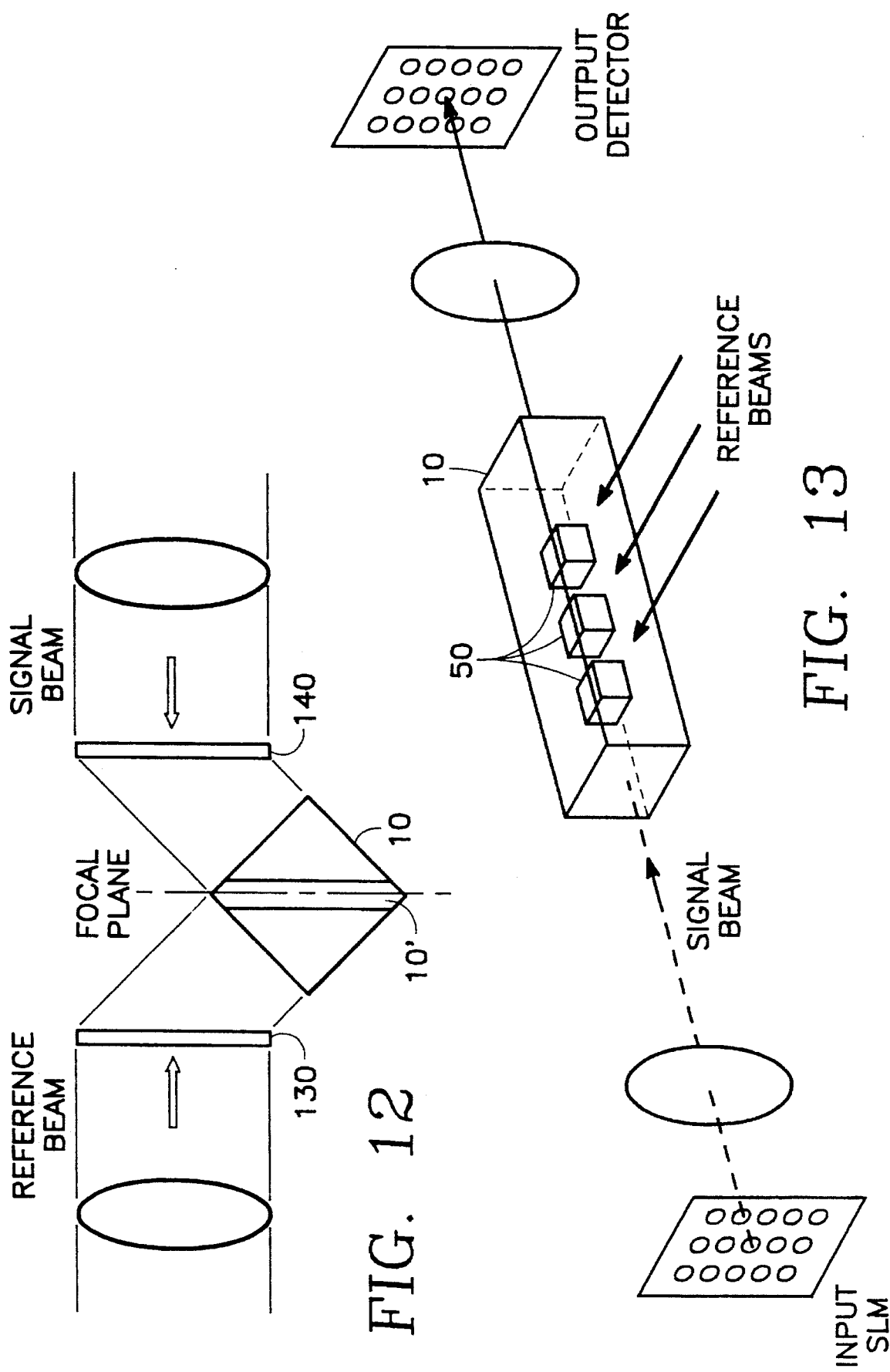

5,550,779

HOLOGRAPHIC MEMORY WITH ANGLE, SPATIAL AND OUT-OF-PLANE MULTIPLEXING

BACKGROUND OF THE INVENTION

1. Origin of the Invention

The U.S. Government has certain rights in this invention pursuant to Grant No. F4962092-J-0400 awarded by the United States Air Force.

2. Technical Field

The present invention relates to holographic memories, holographic storage systems and holographic processors.

3. Background Art

The traditional advantages of 3-D holographic memories are high storage density and parallel access capability. These features were recognized in the early 1960's and serious efforts towards the practical implementation of such memories were undertaken. Unfortunately, these efforts did not produce commercially viable memories. In recent years there has been a resurgence of interest in 3-D optical storage due to considerable improvement in the understanding and availability of storage media, a dramatic improvement in opto-electronic components in general, and most importantly, the emergence of applications such as image processing, neural networks, and databases where the capabilities of these memories can be effectively utilized. This recent activity has culminated in the storage of $5 \times 10^3$, 320×220-pixel holograms in a volume roughly equal to 2 cm$^3$. See Fai H. Mok, "Angle-multiplexed storage of 5000 holograms in lithium niobate", *Optics Letters*, Jun. 1, 1993, Vol., 18, No. 11, pp. 915–917. If spatial light modulators with 1 million pixels are used, then the storage density achievable to day is in excess of $10^9$ bits per cm$^3$. This storage capability should be compared with the density of other technologies, but most importantly the capabilities of random access semiconductor memories. Experimental RAM chips with 64 megabits have been demonstrated. 16 such chips mounted on a board could replace a holographic memory with a volume equal to 1 cm$^3$. Therefore, it is imperative, if optical memories are to be competitive, that systems with much higher volume than 1 cm$^3$ are constructed with as high a storage density as possible. Spatial multiplexing is the most straightforward way to increase the volume in which information is stored. Spatial multiplexing, in which angularly superimposed holograms are recorded at multiple spatial locations, automatically implies a scanning mechanism to address the different locations. We can use either mechanical or non-mechanical scanning. Non-mechanical spatial scanning is generally much faster, being able to access any one of the stored holograms in a time approximately equal to the access time of simple angle-multiplexed holographic memories. Several non-mechanical scanning mechanisms have been previously described, such as acousto-optical devices.

Prior to the present invention, we developed a 3-D holographic optical memory that combined spatially and angularly multiplexed storage to yield a storage capacity of approximately $10^{12}$ bits in a crystal with volume less than 100 cm$^3$. A non-mechanical scanning mechanism in that memory, consisting of acoustooptic deflectors and a segmented mirror, can retrieve any stored hologram in a time equal to the acoustic delay through the aperture of the acoustooptic deflector. In one proposed implementation, that memory had a storage capacity approaching $10^{12}$ bits in a crystal with a volume of 64 cm$^3$, and random hologram-access time of 10–100 µs (Mok et al., "Spatially- and Angle-multiplexed Holographic Random Access Memory," *SPIE Photonic Neural Networks*, Vol. 1773 (1992), pages 334 et seq.). The key aspect of that memory was the non-mechanical scanning system we employed that made use of acoustooptic deflectors in conjunction with a segmented mirror in order to facilitate both angular and spatial scanning.

The overall system of our prior memory is shown in FIG. 1, and is described below with specific numbers for most of the relevant components. Obviously, the system can be scaled for a different capacity. The numbers we quote are based on what we believed was possible to fabricate with currently available technology. The storage medium 10 is a photorefractive crystal such as LiNbO$_3$. Holograms are stored in multiple locations on the crystal 10. The locations are arranged in a regular 16 by 16 grid. Each location stores up to 4,000 angle-multiplexed holograms.

A vertically-deflecting acousto-optical device (AOD) 12 in the reference arm 13 of the system steers the reference beam to the location on the crystal 10 where a hologram is to be written. The vertically-deflecting AOD 12 deflects the collimated light vertically to a selected mirror strip 14 in a segmented mirror array 16 of 256 mirror strips 14 that are stacked vertically. Each of the mirror strips 14 has a unique orientation. The orientation of each mirror strip 14 is designed to redirect the incident light (both horizontally and vertically) to one of the 16×16 locations on the LiNbO$_3$ crystal 10. In this way, the deflection angle of the vertically-deflecting AOD 12 specifies which mirror strip 14 is illuminated which in turn selects the location of the reference beam on the crystal 10. FIG. 2A shows how the combination of the vertically-deflecting AOD 12 and the segmented mirror array 16 directs the reference beam to different locations on the storage medium 10.

FIG. 2B illustrates a horizontally-deflecting AOD 18 of the system and one of the strips 14 of the segmented mirror array 16, demonstrating how the angle of the reference beam is scanned in the horizontal direction without changing the beam location on the crystal 10, in order to provide angle multiplexing. The horizontally-deflecting AOD 18 deflects the beam horizontally. The horizontally deflected light remains on the same mirror strip 14 as long as the vertical deflection by the vertically-deflecting AOD 12 remains constant. Since the segmented mirror array 16 lies in the Fourier plane of the crystal 10, the position of the reference beam on the crystal 10 also remains unchanged. The deflection by the horizontally-deflecting AOD 18 changes the angle of incidence of the reference beam on the crystal 10 to provide the multiple angles needed for angular multiplexing of superimposed holograms. In this way, the vertically-deflecting AOD 12 (in combination with the segmented mirror array 16) selects the location of the reference beam on the crystal 10, whereas the horizontally-deflecting AOD 18 selects the angle of incidence ψ (see FIG. 8) of the reference beam on the crystal 10.

The segmented mirror array 16 may be fabricated by employing the technique currently used to make blazed gratings. This technique involves using a diamond tip to cut grooves on suitable substrates, as shown in FIG. 3. The angles of the grooves are accurately controlled by the tilt of the diamond tip with respect to the substrates. The width of each groove is controlled by the number of cuts in the same groove.

The number of mirror strips 14 in the array 16 is equal to the number of distinct locations within the storage medium or crystal 10. In other words, there a one-to-one correspondence between mirror strips and storage locations, a significant limitation. There are, therefore, 16×16 mirror strips 14 within the segmented mirror array 16. Referring to FIGS. 4A–4D, the mirror array 16 has sixteen sub-arrays 20a–20p. Each sub-array 20 consists of sixteen of the mirror strips 14. The change $\Delta\alpha$ in the mirror strip angle $\alpha$ from one mirror strip 14 to the next is 0.5°. The sixteen sub-arrays 20 are identical except that differently-angled ramps 21 are cut out of the substrates 22 of the different sub-arrays 20 so that successive sub-arrays 20 lie at different ramp angles $\theta$. The change $\Delta\theta$ in the ramp angle $\theta$ from one sub-array 20 to the next is 0.5°. The direction of angular change of the sub-array ramps 21 is orthogonal to that of the mirror strips 14, thereby providing two-dimensional spatial scanning of the reference beam.

FIG. 5A shows the spatial multiplexing of the signal (object) beam in a one dimension. (Spatial multiplexing in the other dimension is identical.) In order to store the holograms in the crystal, each page (image plane or Fourier plane) is first displayed at an input spatial light modulator (SLM) 24. The size of the pages is limited by the space-bandwidth-product (SBP) of the SLM 24. The SLM 24 is illuminated by a plane wave whose angle of incidence is determined by the signal applied to a vertically-deflecting and horizontally-deflecting input AODs 26, 27 (of FIG. 1). The light at the SLM 24 and at the plane of the crystal 10 are a Fourier transform pair. Therefore, we can shift the location where the light is focused on the crystal 10 by the input AODs 26, 27 changing the angle of illumination of the SLM 24. Thus, the input AODs 26, 27 control which location on the crystal 10 is being written. During recording, electrooptic phase modulators 28, 30 compensate the frequency shifts introduced by the AODs 12, 18, 26, 27 (of FIG. 1).

The set-up in FIG. 5A requires that each input AOD 26, 27 has a space-bandwidth product (SBP) of M×N, where M is the number of locations and N is the SBP of the SLM 24 in one dimension. In the case that M=16 and N=1,000, the SBP requirement on each AOD 26, 27 would be 16,000, which is clearly outside the reach of current technology. The SBP requirement on each input AOD 26, 27 can be alleviated by using two 16×16-element lenslet arrays 32, 34 as shown in FIG. 5B. In such case, the SBP required of each input AOD 26, 27 is reduced to $MNf_2/f_1$.

Referring to FIG. 1, each stored page is associated with a unique reference beam characterized by its angle of incidence and its location in the crystal 10. Any one of the stored pages can be accessed by simply illuminating the storage medium or crystal 10 with the appropriate reference beam. This reference beam is generated by the same system used during the recording phase. The Fourier transform of the page associated with this reference beam will be reconstructed. An output detector array 38, which is at the Fourier plane of the storage medium or crystal 10, will register the image of the reconstructed page of information. A pulsed laser 40 is used as the readout light source. Since sufficient photons are delivered in a compressed time slot, the memory access time is minimized. Firing of the laser 40 is synchronized with the launching of the acoustic waves within the AODs 12, 18. The laser 40 is charged to full firing potential while data is read from the detector array.

The sufficient condition for data pixels to be resolvable at the detector plane 38 is that Fourier transform lenses 42, 44 of FIG. 1 have SBPs in excess of MN, or 16,000. The energy distribution of the Fourier spectrum can be made more uniform by using a diffuser 48 as shown in FIG. 6. If the diffuser 48 only encodes phase information, there should be no excessive information loss at the output plane.

SUMMARY OF THE DISCLOSURE

The invention is embodied in an optical memory having a holographic recording medium capable of storing respective holograms in a single column of respective storage spots, the memory including a coherent collimated light source of a reference beam and an object beam illuminating the recording medium, a segmented optical array including a stack of plural segmented optical sub-arrays, each of the segmented optical sub-arrays including a column of generally parallel optical strips, each optical strip having a strip length extending parallel to the optical strips and transverse to the column of optical strips, respective optical strips of all of the sub-arrays providing an optical path for the reference beam to respective recording spots in the single column of recording spots in the holographic recording medium whenever the reference beam is incident within the strip length, two optical strips in different sub-arrays with optical paths to the same recording spot being separated by at least an out-of-plane multiplexing difference angle subtended by paths of the reference beam to the two optical strips, a reference beam steering apparatus for scanning the reference beam to different locations on the segmented optical array, and a modulator apparatus for modulating the object beam with a succession of input patterns simultaneously with the scanning of the reference beam by the reference beam steering apparatus so as to record a plurality of angle multiplexed and out-of-plane multiplexed holograms in at least one of the recording spots.

Each of the sub-arrays corresponds to a different out-of-plane multiplexing angle of the reference beam, each of the optical strips within a given sub-array corresponds to a different recording spot in the single column of recording spots for spatial multiplexing, and each reference beam location along the strip length of a given optical strip corresponds to a different scan angle for angle multiplexing.

In one implementation, the reference beam steering apparatus scans the reference beam along the strip length of a selected one of the optical strips through a succession of scan angles simultaneously with the modulator apparatus modulating the object beam with the succession of input patterns.

In accordance with a first embodiment, each of the optical strips in a given one of the sub-arrays includes a mirror strip having a strip angle $\alpha$ which differs from the strip angle of an adjacent mirror strip by a difference strip angle $\Delta\alpha$, the difference strip angle $\Delta\alpha$ corresponding to a deflection of the reference beam between adjacent recording spots in the single column of recording spots in the holographic recording medium.

In accordance with a second embodiment, the optical strips in a given one of the sub-arrays each include a diffraction grating strip having diffraction grating lines extending parallel to the length of the strip transverse to the column of optical strips, the diffraction grating lines in each strip having a line-to-line spacing providing a diffraction angle of a path of the reference beam to the corresponding one of the recording spots in the single column of recording spots in the holgraphic recording medium. The diffraction grating strips are preferably transmissive.

The memory further includes a detector plane facing the holographic recording medium, and a lens between the holographic recording medium and the detector plane, whereby to focus a reconstructed hologram previously recorded in the holographic recording medium onto the detector plane whenever the object beam is blocked. Generally, the detector plane is aligned with the path of the object beam to the holographic recording medium. The out-of-plane multiplexing difference angle is sufficiently great so that holograms recorded in the same recording spot with reference beams at the same scan angle on different optical strips are reconstructed in separate locations near the detector plane.

The invention is also embodied in a method of processing holograms in a holographic recording medium, including directing coherent reference and object beams of light onto a selected recording spot in the medium, the reference and object beams defining a plane of interaction in the medium, changing a plane of interaction incidence angle of the reference beam in the plane of interaction at the selected recording spot for recording different angle multiplexed holograms in the selected recording spot, changing an orthogonal angle of incidence of the reference beam in a plane orthogonal to the plane of interaction at the selected recording spot through a succession of angles in the orthogonal plane separated by at least a predetermined difference angle in the orthogonal plane, to record different out-of-plane multiplexed holograms in the recording spot, and modulating the object beam with different input patterns for different ones of the plane of interaction incidence angles and orthogonal incidence angles. The predetermined difference angle in the orthogonal plane is sufficiently great so that reconstruction of out-of-plane multiplexed holograms recorded in the recording spot at the same plane of interaction incidence angle are spatially separated.

The method further includes reconstructing a selected hologram previously recorded in the medium at a selected recording spots, by blocking the object beam from the medium, and then directing the reference beam to a selected recording spot in the medium at a plane of interaction incidence angle and an orthogonal incidence angle used when the selected hologram was recorded in the selected recording spot.

An advantage of the invention is that the system is not limited by any one-to-one correspondence between mirror strips and storage locations. The invention can have any number S of storage locations with any number F of out-of-plane rows of holograms per location, using S×F mirror strips. The storage locations in the medium may be in any pattern such as a single column or a staggered column, for example.

BRIEF DESCRIPTION OF THE DRAWINGS

FIG. 5A is a diagram illustrating how Fourier transforms of SLM images are spatially multiplexed in the system of FIG. 1 by changing the incidence angle of the collimated beam at the SLM.

FIG. 5B illustrates how a lenslet array is employed to reduce the SBP requirement on the AOD of FIG. 5A.

FIG. 12 is a diagram illustrating a non-orthogonal optical architecture for implementing the invention.

FIG. 13 is a diagram illustrating an embodiment in which the reference and signal beams are mutually orthogonal at the recording medium.

DETAILED DESCRIPTION OF THE PREFERRED EMBODIMENTS

Figure 1:
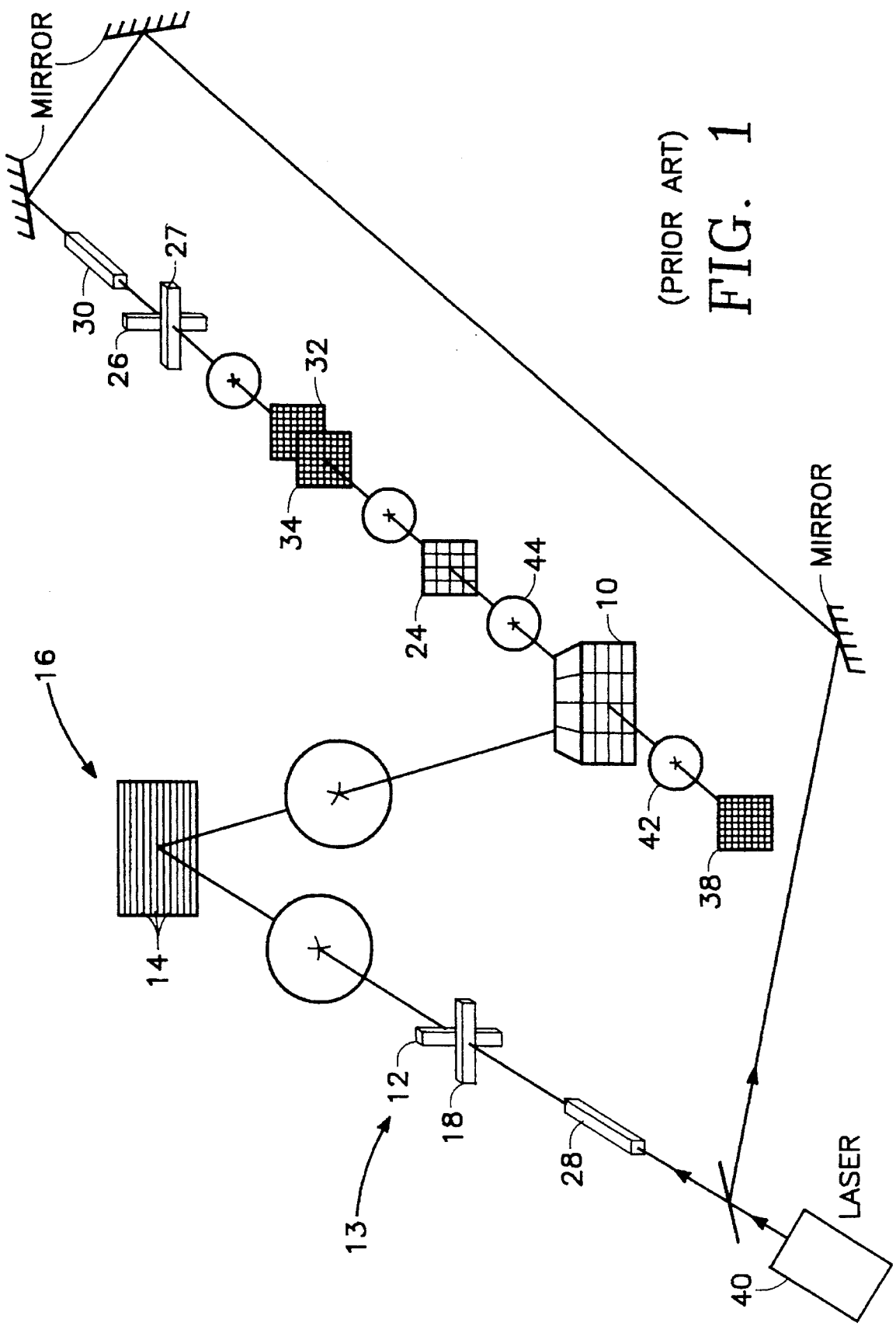
FIG. 1 is a schematic diagram of a holographic memory system with spatial and angle multiplexing we developed prior to the present invention.
Figure 2A:
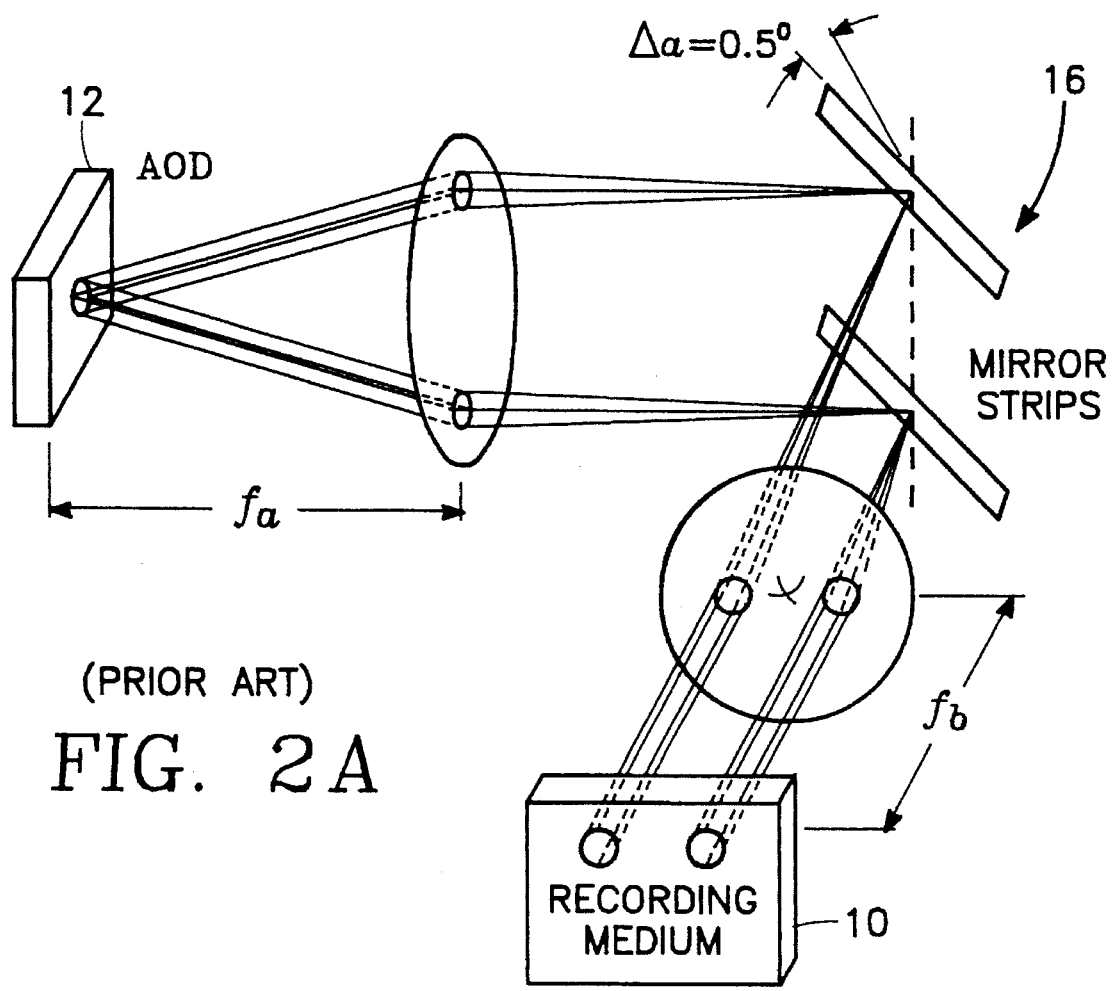
FIG. 2A is a diagram of a two-element mirror array illustrating how a vertically-deflecting AOD in the system of FIG. 1 directs light to different locations in the storage medium for spatial multiplexing.
Figure 2B:
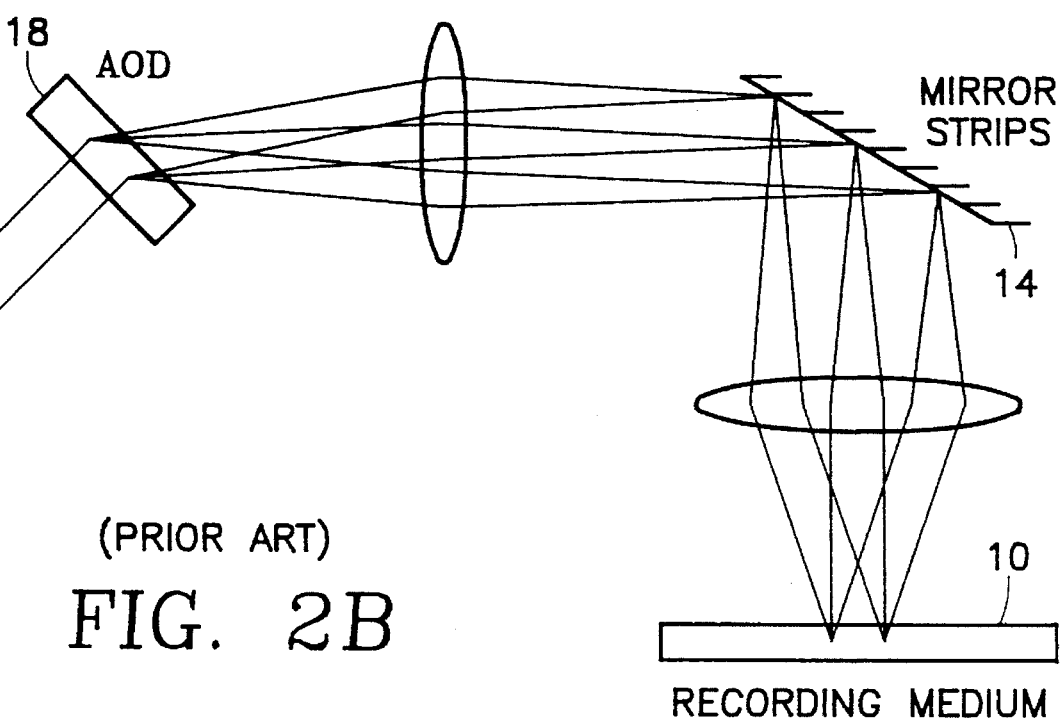
FIG. 2B is a diagram showing three collimated beams with different incidence angles on the storage medium within a common location on the medium for angle multiplexing in the system of FIG. 1.
Figure 3:
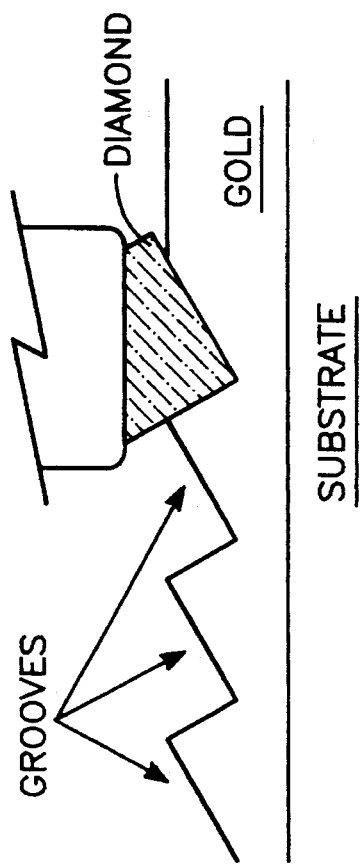
FIG. 3 illustrates a blazed grating technique for making a mirror array in the system of FIG. 1.
Figure 4B:
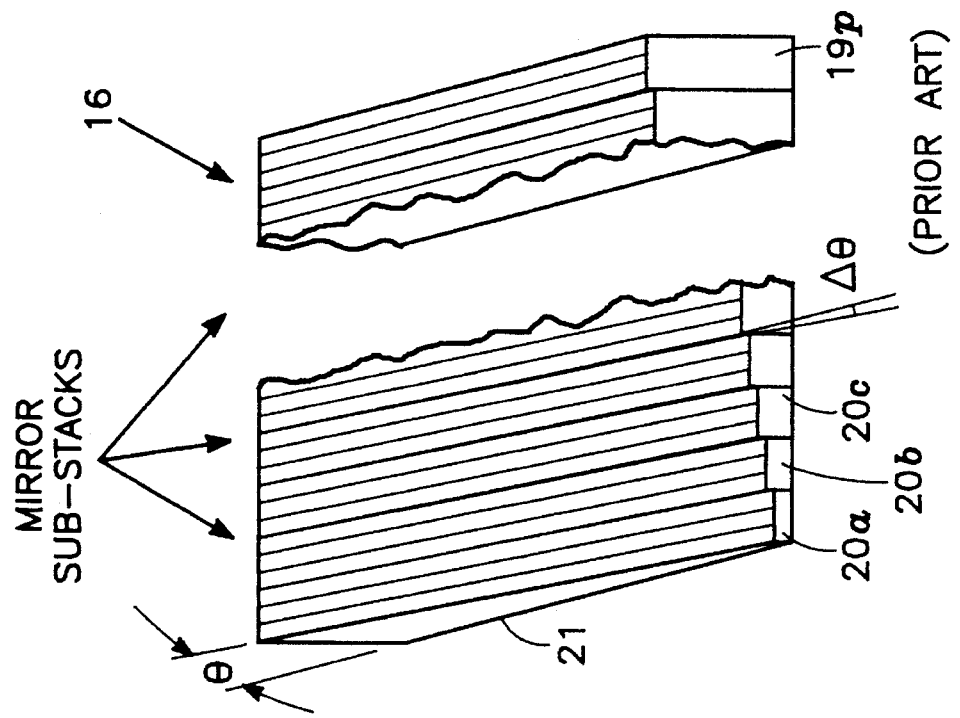
FIGS. 4A, 4B, 4C and 4D illustrate the segmented mirror array in the system of FIG. 1.
Figure 4A:
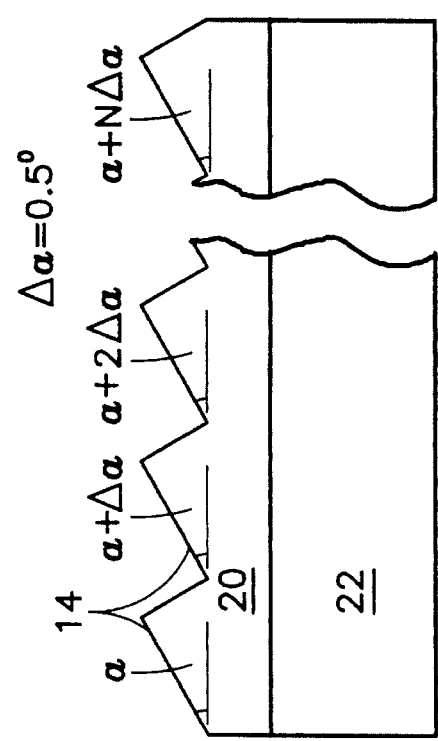
Figure 4C:
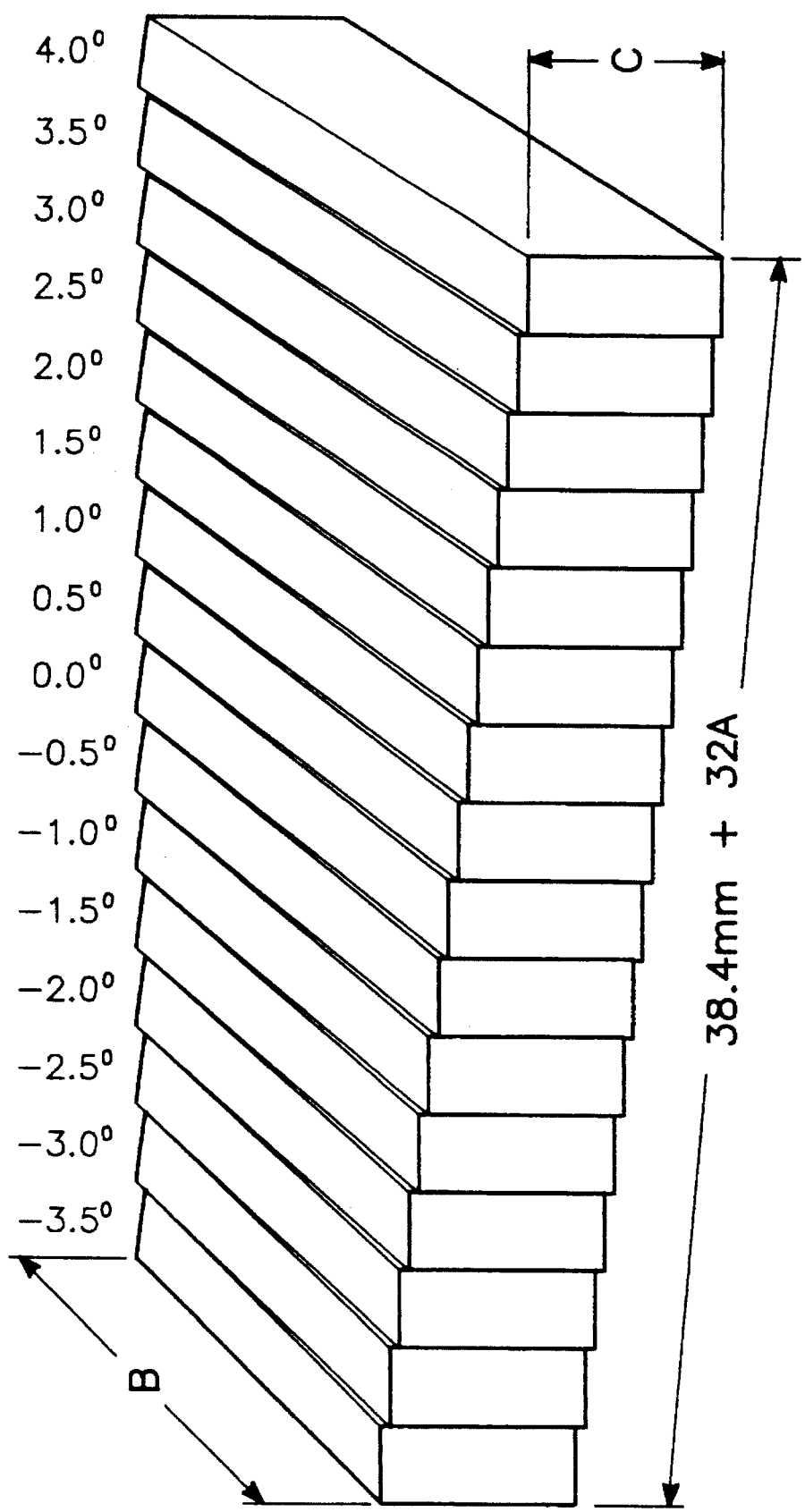
Figure 4D:
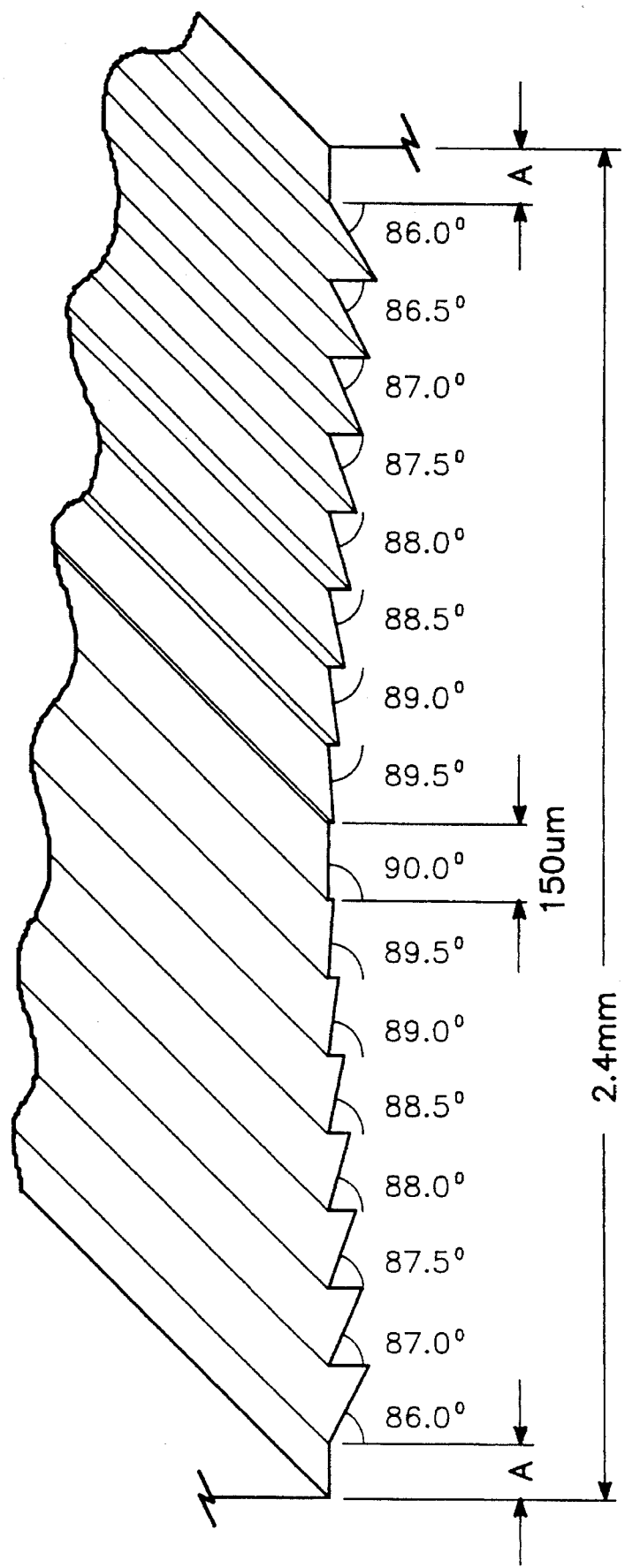
Figure 7:
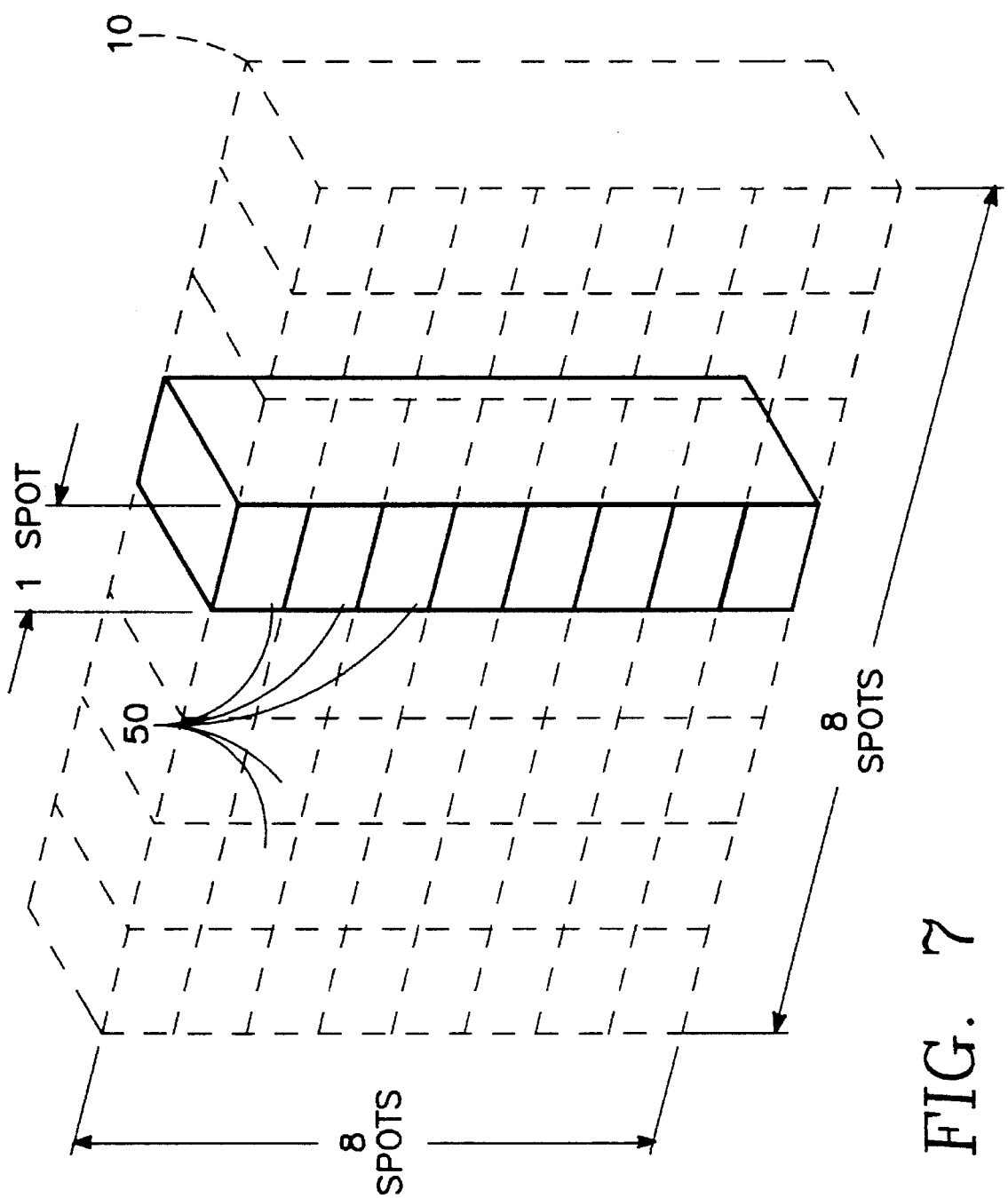
FIG. 7 is a diagram comparing the memory architecture of the present invention with the system of FIG. 1.

As shown in FIG. 7, the memory system of FIG. 1 stores holograms in the medium 10 in recording spots 50 arranged in horizontal rows and vertical columns (indicated in dashed line in FIG. 7), there being sixteen rows and sixteen columns in the implementation of FIG. 1. In the present invention, out-of-plane multiplexing is employed to push all of the vertical columns into a single column, so that all of the information stored in the system of FIG. 1 across sixteen columns (for example) is now stored in a single column in the present invention.

Figure 8:
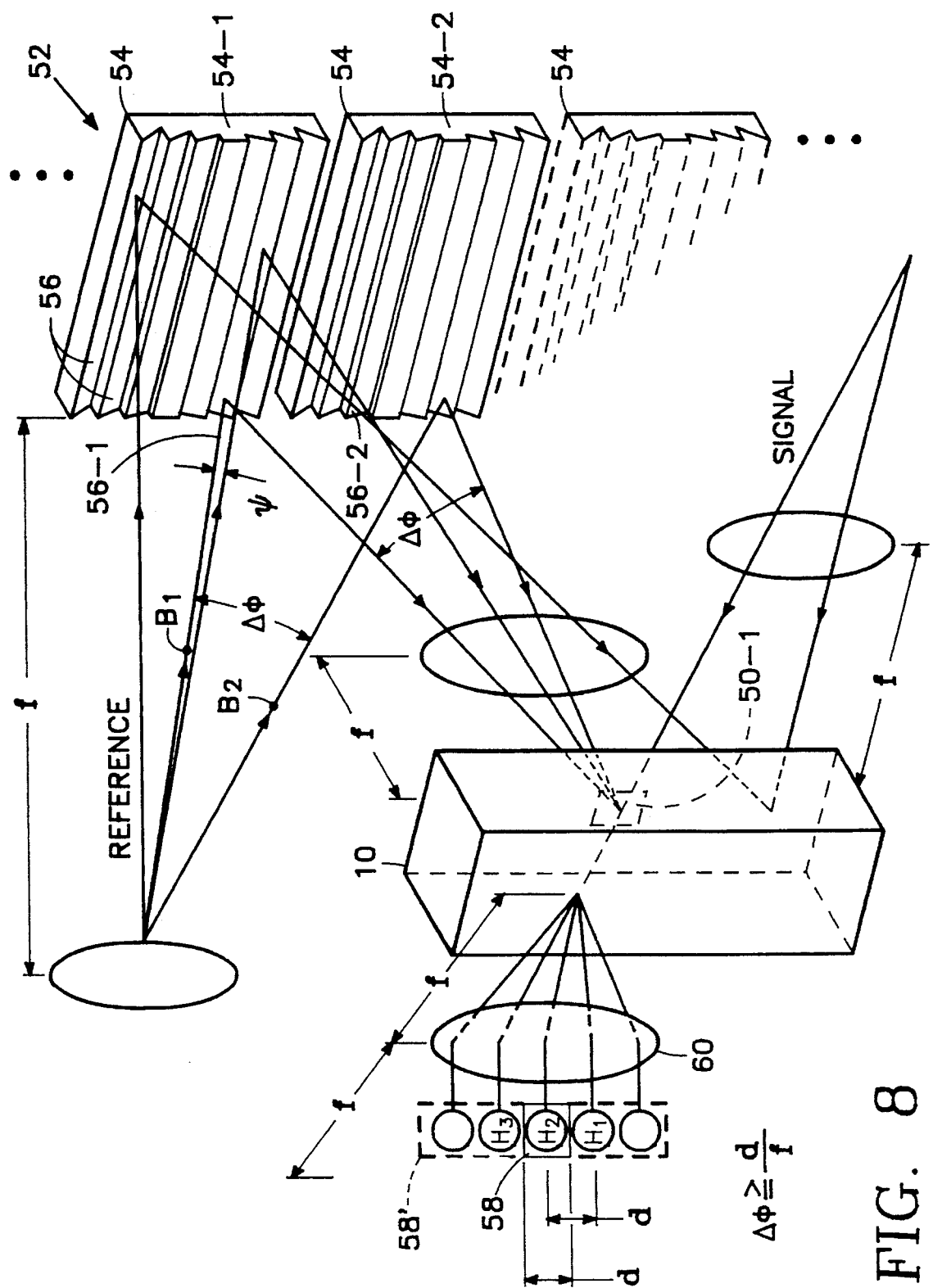
FIG. 8 is a simplified schematic diagram of a first embodiment of the present invention employing a segmented mirror array.

This is accomplished in the embodiment of FIG. 8 with a segmented mirror array 52 consisting of plural (e.g., sixteen) sub-arrays 54 stacked vertically. Each sub-array 54 consists of plural (e.g., sixteen) mirror slits 56. Like the mirror slits 14 of FIGS. 4A–4D, each mirror slit 56 is disposed at a particular slit angle α which differs from the slit angle of the neighboring mirror slit by a mirror slit difference angle Δα. However, unlike the sub-arrays 16 of FIGS. 4A–4D, each sub-array 54 of FIG. 8 has the same ramp angle θ, the difference ramp angle Δθ from one sub-array 54 to the next being zero. In a preferred implementation, the ramp angle θ of all the sub-arrays is zero, although any other suitable ramp angle may be chosen. As in the array 16 of FIGS. 4A–4D, in FIG. 8 the sequence of slit angles α is the same from one sub-array 54 to the next.

Spatial and Angle Multiplexing:

Within a given sub-array 54, each incremental change Δα in the slit angle α from one mirror slit 56 to the next corresponds to a change in beam incidence from one recording spot 50 to the next in the single vertical column of recording spots 50 in the medium 10, to provide spatial multiplexing. The reference and signal beams lie in and define a horizontal plane of interaction. As the reference beam is scanned horizontally within the plane of interaction across a given one of the mirror slits 56 through increasing or decreasing scan angle ψ, the beam stays on the corresponding recording spot 50 in the medium 10 while its incidence angle on the recording spot 50 changes, to provide angle multiplexing.

Figure 9:
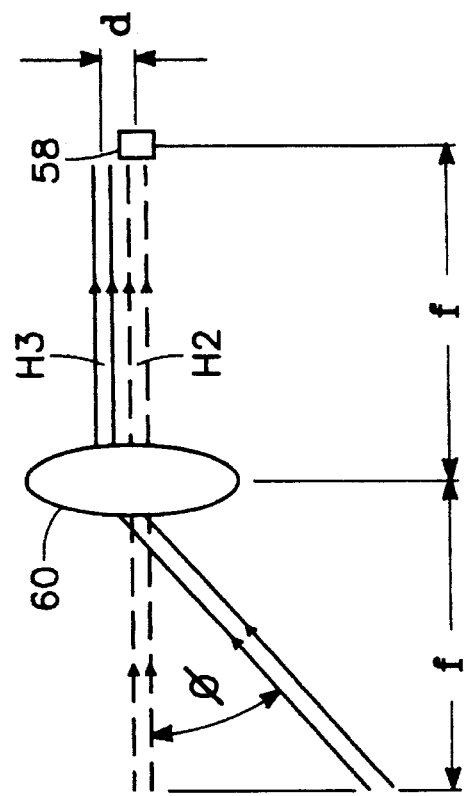
FIG. 9 is a diagram illustrating how out-of-plane multiplexing is provided the present invention.
Figure 6:
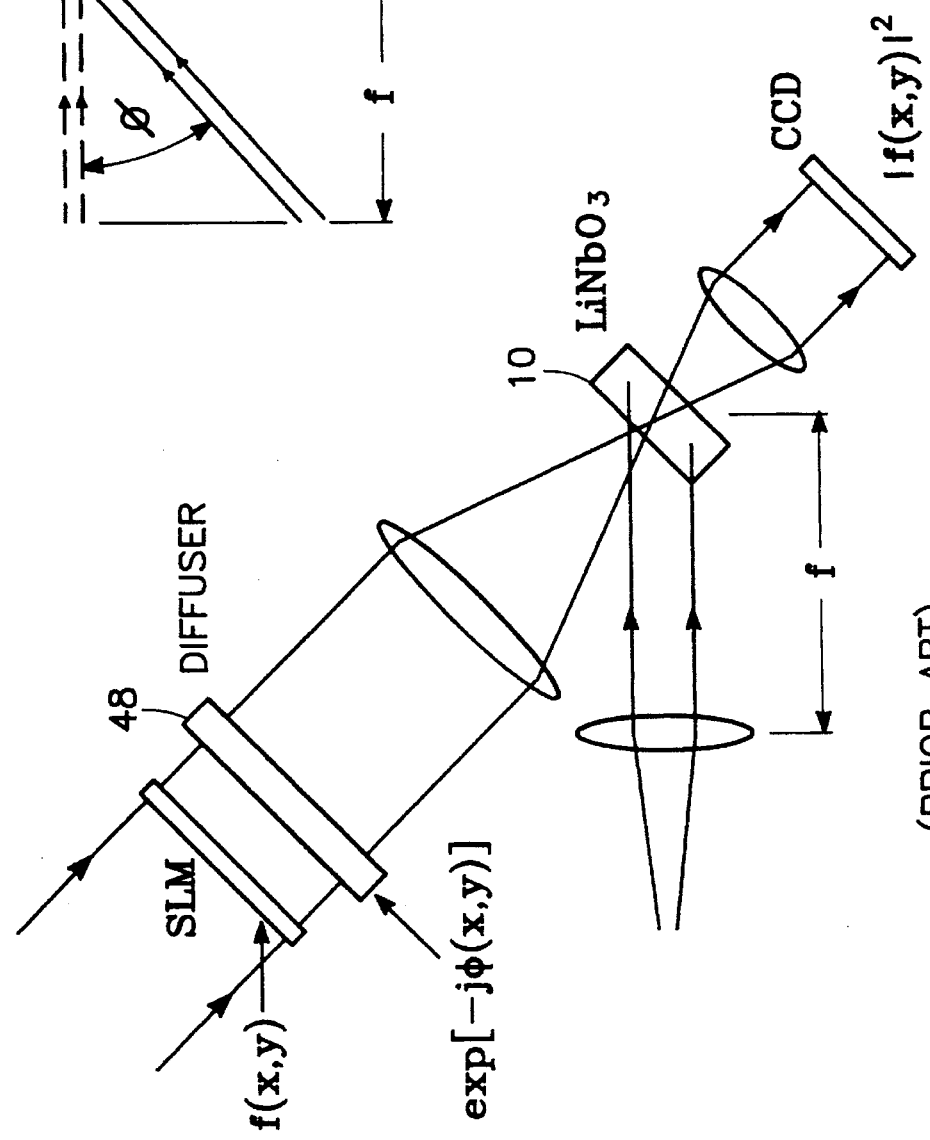
FIG. 6 is a diagram depicting how a diffuser is employed in the system of FIG. 1.

Out-of-Plane Multiplexing:

A fundamental feature of the mirror array 52 of FIG. 8 is that the distance between any two corresponding mirror slits 56 of the same slit angle α (e.g., the mirror slits 56-1 and 56-2) in adjacent sub-arrays (e.g., the sub-arrays 54-1 and 54-2) corresponds to at least a threshold vertical difference angle Δφ between reference beams B1 and B2 incident on respective ones of the two mirror slits 56 (e.g., 56-1 and 56-2). The vertical difference angle Δφ lies in a vertical plane orthogonal to the horizontal plane of interaction (defined above). The vertical difference angle Δφ is sufficiently great so that a pair of holograms (H1, H2) recorded with reference beams from the two corresponding mirror slits (56-1 and 56-2) at the same scan angle ψ are reconstructed near a detector plane 58 at different locations, the reconstruction (H1, H2) being displaced from one another by at least their diameter d, all but one of the reconstructions being outside of the detector plane 58. If a reconstruction lens 60 of focal length $f$ is placed between the detector plane 58 and the medium 10 with a distance $f$ therebetween, then the desired displacement near the detector plane 58 between adjacent reconstructed holograms (H1 and H2) is realized as illustrated in FIG. 9 by requiring the vertical difference angle Δφ to satisfy the following relation:

$$d \leq f \times \Delta\phi$$

While the invention is described with reference to a detector plane 58 having a size capable of capturing a single one of the reconstructions (H3, for example), in an alternative embodiment an enlarged detector plane 58' (dashed line in FIG. 8) may be employed having a sufficient area to capture all of the reconstructions (H1, H2, H3 and so forth) simultaneously in different pixels. Alternatively, the enlarged detector array 58' may be separated detector arrays, each separate array capturing a respective one of the reconstructions (H1, H2, H3, and so forth) so that all of the reconstructions are captured simultaneously.

Recording:

In the embodiment of FIG. 8, the reference beam is scanned through a range of scanning angles ψ across a selected mirror strip 56 disposed at a strip angle α corresponding to the desired recording spot 50 in the holographic storage medium 10. Simultaneously, the signal beam is modulated with a succession of input patterns corresponding to holograms to be recorded, and is directed to the same recording spot 50 as the reference beam. In order to record a maximum number of holograms in the same recording spot, the reference beam is next moved to a mirror strip 56 in the adjacent sub-array 54 disposed at the same slit angle α so that the vertical incidence angle φ of the reference beam at the recording spot 50 changes by Δφ. The reference beam is now scanned through a succession of scan angles ψ along the latest mirror strip 56 while the signal beam is modulated with the next succession of input patterns. This process is repeated for the mirror segment 56 in each sub-array 54 disposed at the same strip angle α, until all possible angle multiplexed and out-of-plane multiplexed holograms have been recorded in the one recording spot 50. Then, the entire foregoing process is repeated for all other recording spots 50 until the medium is filled.

The roles of the reference and signal beams may be reversed, so that the signal beam is the one which is directed to the mirror array 52. In a preferred embodiment, the signal and reference beams are mutually orthogonal at the recording medium 10, although a suitable orientation other than orthogonal may be chosen.

Reconstruction:

Whenever a particular hologram is to be reconstructed at the detector plane 58, the signal beam is blocked while the reference beam is directed at the scan angle ψ used when the desired hologram was recorded and to the mirror slit 56 illuminated when the desired hologram was recorded. The selection of a particular mirror slit 56 unambiguously determines both the recording spot 50 in the single column as well as the vertical incidence angle φ. This causes the selected hologram (e.g., hologram H2) to be reconstructed at the detector plane 58. At the same time, all other holograms (e.g., H1, H3, H4, etc.) recorded in the same recording spot 50 at the same scan angle ψ are reconstructed as well, but not within the detector plane 58. If the detector plane 58 is about the diameter d of the reconstruction beam, then only the desired reconstructed hologram is sensed by the detector plane 58.

In an alternative embodiment, the detector plane 58 of diameter d is replaced by a very large detector plane 58' which captures all of the reconstructed holograms H1, H2, H3, H4, etc., simultaneously.

Figure 10:
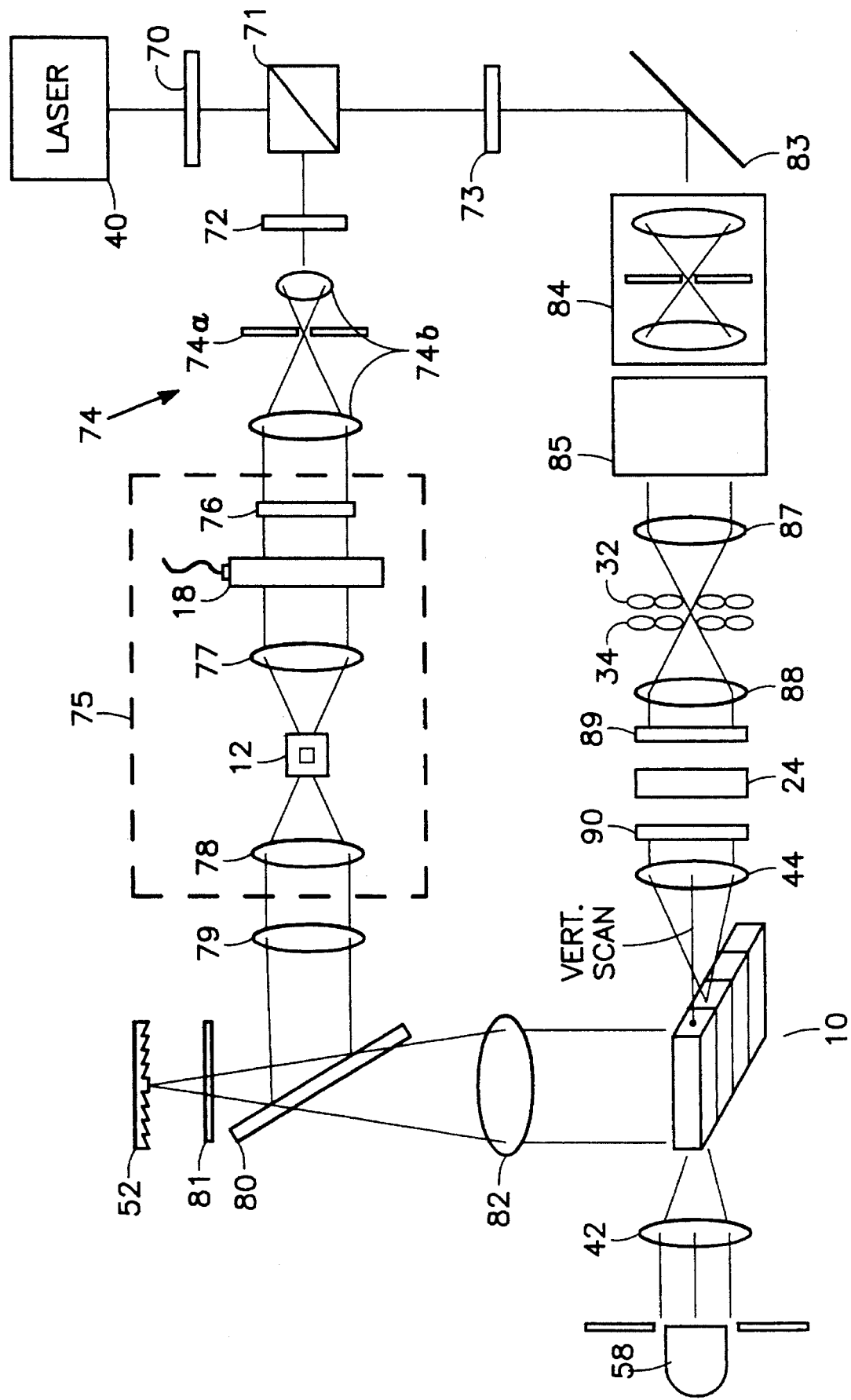
FIG. 10 is a detailed schematic diagram of an exemplary implementation of the embodiment of FIG. 8.

Exemplary Implementation:

FIG. 10 illustrates an exemplary implementation of the embodiment of FIG. 8. A laser beam from a laser 40 passes through a half-wave plate 70 and a polarizing beam splitter 71 which splits the beam into a reference beam incident on a half-wave plate 72 and a signal beam incident on a half-wave plate 73 which correct for any polarization change induced by the polarizing beam splitter 71.

Reference Channel:

A collimator 74 including a spatial filter 74a and a collimating lens 74b expands the reference beam, which then passes through an AOD angle scanner 75. The AOD angle scanner 75 consists of a horizontal cylindrical lens 76 which narrows the reference beam to a horizontal line coinciding with a horizontal AOD 18 which shifts the angle of the reference beam within the plane of the drawing of FIG. 10. The shifted reference beam is transformed into a vertical line by a spherical lens 77, the vertical line coinciding with a vertical AOD 12, which shifts the reference beam out of the plane of the paper. A vertical cylindrical lens 78 collimates the reference beam and a spherical lens 79 focuses the reference beam onto the segmented mirror array 52 through a polarizing beam splitter 80. The reflected beam passes from the segmented mirror array 52 through a quarter-wave plate 81 (which reduces losses from the polarizing beam splitter 80) and is directed onto the recording medium or crystal 10 by a spherical lens 82.

Signal Channel:

The signal beam passes from the half-wave plate 73, is deflected by a mirror 83 to a collimator 84 identical to the collimator 74 in the reference arm and thence to an AOD angle scanner 85 identical to the AOD angle scanner 75 in the reference channel. Only the vertical part of the AOD angle scanner 75 is employed. A pair of spherical lenses 87, 88 images the signal beam onto the SLM 24 through a quarter-wave plate 89 which optimizes the SLM contrast. The lenslet arrays 32, 34 may be placed between the pair of lenses 87, 88 in the manner illustrated in FIG. 5B. A polarizer 90 converts the phase modulation of the SLM 24 to amplitude modulation, and the Fourier transform is focused onto the recording medium 10 by a lens 44. The recording medium is a vertical stack (out of the plane of the drawing of FIG. 10) of Lithium Niobate crystals.

Holograms are reconstructed by blocking the signal channel while illuminating the medium 10 with the reference beam and focusing the beam emanating from the recording medium 10 through a lens 42 onto a detector plane 58.

Figure 11:
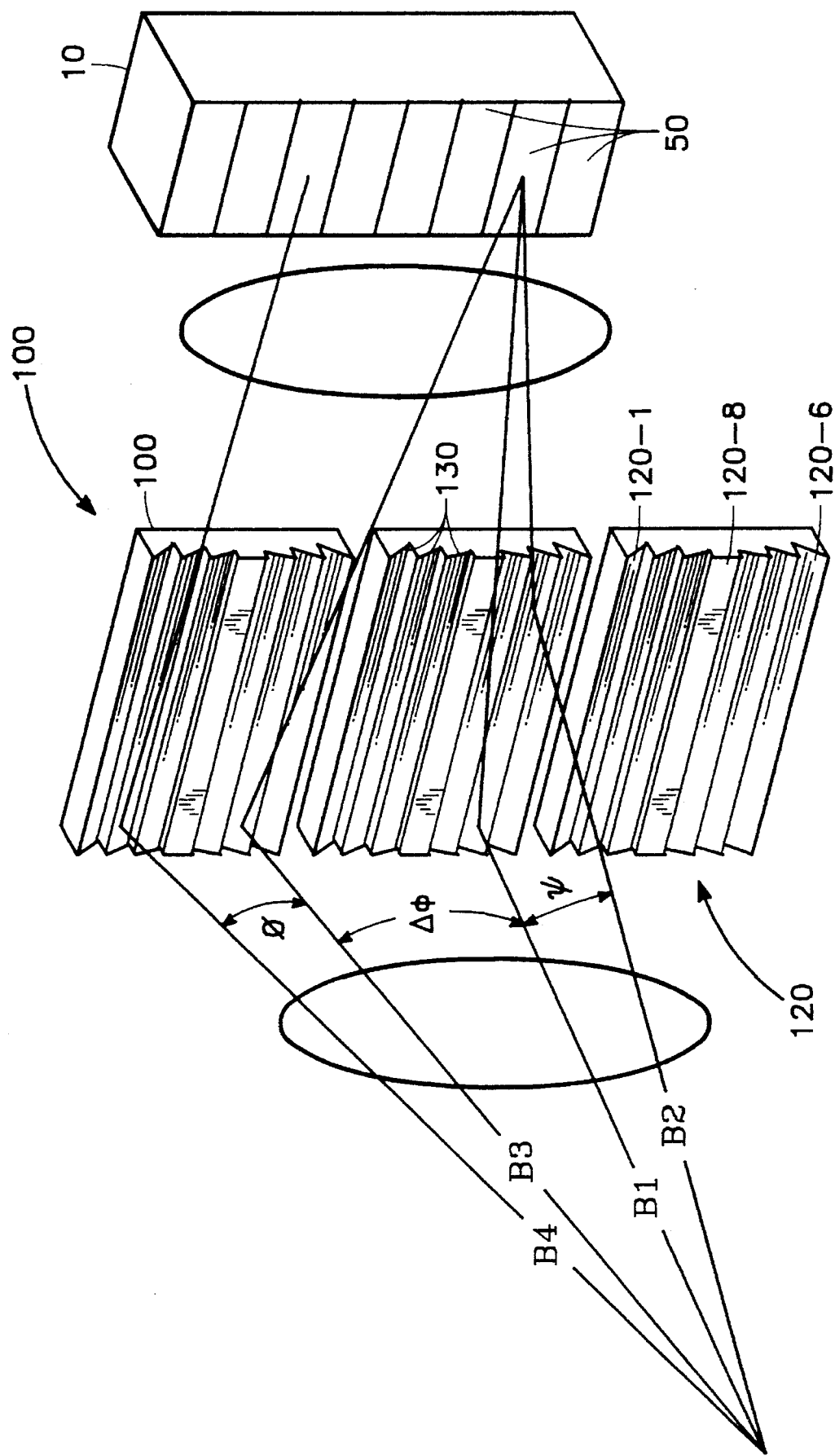
FIG. 11 is a simplified schematic diagram of a second embodiment of the invention employing a segmented diffraction grating array.

Segmented Diffraction Grating Array:

Referring to FIG. 11, the reflective segmented mirror array 52 of FIG. 8 is replaced by a transmissive segmented diffraction grating array 100. The array 100 consists of plural sub-arrays 110 (corresponding to the sub-arrays 54 of FIG. 8) stacked vertically. Each sub-array 110 consists of plural diffraction grating strips 120 (corresponding to the mirror strips 56 of FIG. 8). Each of the grating strips 120 consists of a transparent film etched with horizontal grating lines 130 across the entire horizontal length of the grating strip 120. The grating strips are all co-planar, the required change $\Delta\phi$ in vertical incidence angle from one grating strip 120 to the next arising from a difference in grating pitch between adjacent strips 120. For example, in each sub-array 110, the middle grating strip 120-8 has no grating lines, the two outermost strips 120-1 and 120-6 having the highest number of grating lines, with a monotonic increase in the number of grating lines per grating strip from strip to strip. The reference beam is transmitted through the segmented diffraction grating array 100 so that the recording medium 10 is located on the opposite of the array 100 from the reference beam source.

In an exemplary embodiment, there are sixteen grating strips 120 in each sub-array 110, the grating pitch increasing from 0 gratings in the center strip to a grating spacing of $$\frac{\lambda}{2 \times \sin 4°}$$

at the top and bottom grating strips 120 of the sub array, where $\lambda$ is the wavelength.

The two beams of FIG. 11, B3, B4 having the same scan angle $\psi$ but different vertical incident angles $\phi$ are diffracted to two different recording spots 50 in the single column of the medium 10. Two beams B1, B3 incident on grating strips 120 with the same grating spacing but in different sub-arrays and therefore displaced by a vertical difference angle $\Delta\phi$ are directed to the same recording spot 50.

FIG. 12 illustrates how the reference and signal beams may be directed to different sides of the recording medium 10 without having peripheral portions of the medium 10 out of focus of either of the two beams. This is accomplished by employing a pair of diffraction gratings 130, 140 which diffract the respective beams downwardly onto different faces of the medium 10. As a result, the active medium 10 coincides with the focal plane of both the reference and signal beams.

FIG. 13 illustrates another embodiment in which the reference and signal beams are mutually orthogonal at the recording medium 10 and the signal beam enfilades the column of recording spots 50 and therefore does not need to be moved from spot to spot with the reference beam. Preferably, a long interaction length architecture is employed in implementing the system of FIG. 13.

While the invention has been described in detail by specific reference to preferred embodiments thereof, it is understood that variations and modifications thereto may be made without departing from the true spirit and scope of the invention.

What is claimed is:

1. An optical memory, comprising:
   a holographic recording medium capable of storing respective holograms in respective storage spots therein;
   a coherent collimated light source of a reference beam and an object beam illuminating said recording medium;
   a segmented optical array comprising a stack of plural segmented optical sub-arrays, each of said segmented optical sub-arrays comprising plural generally parallel optical strips, each optical strip having a strip length extending parallel to said optical strips, respective optical strips of each sub-array providing an optical path for said reference beam to respective recording spots in said holographic recording medium whenever said reference beam is incident within said strip length, two optical strips in different sub-arrays with optical paths to the same recording spot being separated by at least an out-of-plane multiplexing difference angle subtended by paths of said reference beam to said optical strips;
   reference beam steering means for scanning said reference beam to different locations on said segmented optical array; and
   modulator means for modulating said object beam with a succession of input patterns simultaneously with the scanning of said reference beam by said reference beam steering means so as to record a plurality of angle multiplexed and out-of-plane multiplexed holograms in at least one of said recording spots.

2. The memory of claim 1 wherein:
   each of sub-arrays corresponds to a different out-of-plane multiplexing angle of said reference beam;
   each of said optical strips within a given sub-array corresponds to a different recording spot in said medium for spatial multiplexing.

3. The memory of claim 1 wherein said reference beam steering means comprises means for scanning said reference beam along the strip length of a selected one of said optical strips through a succession of scan angles simultaneously with the modulator means modulating said object beam with said succession of input patterns.

4. The memory of claim 1 wherein said object beam illuminates all of said recording spots simultaneously.

5. The memory of claim 1 wherein said object beam illuminates one of said recording spot at a time, said memory further comprising:
   object beam steering means for directing said object beam to a recording spot illuminated by said reference beam.

6. The memory of claim 1 wherein each of said optical strips in a given one of said sub-arrays comprises a mirror strip having a strip angle $\alpha$ which differs from the strip angle of an adjacent mirror strip by a difference strip angle $\Delta\alpha$, said difference strip angle $\Delta\alpha$ corresponding to a deflection of said reference beam between adjacent recording spots in said holographic recording medium.

7. The memory of claim 1 wherein each one of at least nearly all of the optical strips in a given one of said sub-arrays comprises a diffraction grating strip having diffraction grating lines extending parallel to the length of said strip transverse to said column of optical strips, the diffraction grating lines in each strip having a line-to-line spacing providing a diffraction angle of a path of said reference beam to the corresponding one of said recording spots in said holgraphic recording medium.

8. The memory of claim 7 wherein each of said diffraction grating strips comprises a transparent material, and wherein the path of said reference beam to said holographic recording medium passes through said segmented optical array.

9. The memory of claim 1 further comprising:
   a detector plane facing said holographic recording medium; and
   a lens between said holographic recording medium and said detector plane, whereby to focus a reconstructed hologram previously recorded in said holographic recording medium onto said detector plane whenever said object beam is blocked.

10. The memory of claim 9 wherein said detector plane is aligned with the path of said object beam to said holographic recording medium.

11. The memory of claim 9 wherein said out-of-plane multiplexing difference angle is sufficiently great so that holograms recorded in the same recording spot with reference beams at the same scan angle on different optical strips are reconstructed in separate locations near said detector plane.

12. The memory of claim 11 wherein:

said lens has a focal length $f$;

a reconstructed hologram near said detector plane has a beam diameter d; and said out-of-plane multiplexing difference angle is an angle $\Delta\alpha$ satisfying the following relationship:

$$d \leq f \times \Delta\alpha.$$

13. An optical memory, comprising:

a holographic recording medium capable of storing respective holograms in respective storage spots therein;

a coherent collimated light source of a first beam and a second beam illuminating said recording medium;

a segmented optical array comprising a stack of plural segmented optical sub-arrays, each of said segmented optical sub-arrays comprising a column of generally parallel optical strips, each optical strip having a strip length extending parallel to said optical strips, respective optical strips of each sub-array providing an optical path for said first beam to respective recording spots in said holographic recording medium whenever said first beam is incident within said strip length, two optical strips in different sub-arrays with optical paths to the same recording spot being separated by at least an out-of-plane multiplexing difference angle subtended by paths of said reference beam to said two optical strips;

beam steering means for scanning said first beam to different locations on said segmented optical array; and modulator means for modulating one of said first and second beams with a succession of input patterns simultaneously with the scanning of said first beam by said beam steering means so as to record a plurality of angle multiplexed and out-of-plane multiplexed holograms in at least one of said recording spots.

14. The memory of claim 13 wherein:

each of said sub-arrays corresponds to a different out-of-plane multiplexing angle of said first beam;

each of said optical strips within a given sub-array corresponds to a different recording spot in said medium for spatial multiplexing.

15. The memory of claim 13 wherein each of said optical strips in a given one of said sub-arrays comprises a mirror strip having a strip angle $\alpha$ which differs from the strip angle of an adjacent mirror strip by a difference strip angle $\Delta\alpha$, said difference strip angle $\Delta\alpha$ corresponding to a deflection of said reference beam between adjacent recording spots in said holographic recording medium.

16. The memory of claim 13 wherein each one of at least nearly all of the optical strips in a given one of said sub-arrays comprises a diffraction grating strip having diffraction grating lines extending parallel to the length of said strip transverse to said column of optical strips, the diffraction grating lines in each strip having a line-to-line spacing providing a diffraction angle of a path of said first beam to the corresponding one of said recording spots in said holographic recording medium.

17. The memory of claim 16 wherein each of said diffraction grating strips comprises a transparent material, and wherein the path of said first beam to said holographic recording medium passes through said segmented optical array.

18. The memory of claim 13 further comprising:

a detector plane facing said holographic recording medium; and a lens between said holographic recording medium and said detector plane, whereby to focus a reconstructed hologram previously recorded in said holographic recording medium onto said detector plane whenever said one beam is blocked.

19. The memory of claim 18 wherein said out-of-plane multiplexing difference angle is sufficiently great so that holograms recorded in the same recording spot with reference beams at the same scan angle on different optical strips are reconstructed in separate locations near said detector plane.

20. The memory of claim 19 wherein:

said lens has a focal length $f$;

a reconstructed hologram near said detector plane has a beam diameter d; and said out-of-plane multiplexing difference angle is an angle $\Delta\alpha$ satisfying the following relationship:

$$d \leq f \times \Delta\alpha.$$

21. A method of processing holograms in a holographic recording medium, comprising:

directing coherent reference and object beams of light onto a selected recording spot in said medium, said reference and object beams defining a plane of interaction in said medium;

changing a plane of interaction incidence angle of said reference beam in said plane of interaction at said selected recording spot for recording different angle multiplexed holograms in said selected recording spot;

changing an orthogonal angle of incidence of said reference beam in a plane orthogonal to said plane of interaction at said selected recording spot through a succession of angles in said orthogonal plane separated by at least a predetermined different angle in said orthogonal plane, to record different out-of-plane multiplexed holograms in said recording spot; and modulating said object beam with different input patterns for different interaction incidence angles and orthogonal incidence angles.

22. The method of claim 21 wherein said predetermined difference angle in said orthogonal plane is sufficiently great so that reconstructions of out-of-plane multiplexed holograms recorded in said recording spot at the same plane of interaction incidence angle are spatially separated.

23. The method of claim 21 wherein the step of changing said orthogonal incidence angle is followed by temporarily maintaining a constant orthogonal incidence angle while the step of changing said plane of interaction incidence angle is carried out simultaneously with the step of modulating the object beam with a succession of input images.

24. The method of claim 21 further comprising directing said reference and object beams to different recording spots in said medium and repeating the other steps at each recording spot illuminated by both the reference and object beams.

25. The method of claim 24 wherein said different recording spots lie in a single column.

26. The method of claim 21 further comprising reconstructing a selected hologram previously recorded in said medium at a selected recording spot, comprising:

blocking said object beam from said medium; and directing said reference beam to a selected recording spot in said medium at a plane of interaction incidence angle and an orthogonal incidence angle used when the selected hologram was recorded in said selected recording spot.

27. A holographic memory comprising:

a holographic recording medium having plural holograms recorded in at least a recording spot therein by reference and object beams defining a plane of interaction, each hologram in said recording spot having been recorded with said reference beam oriented at a particular scan angle measured in said interaction plane and a particular out-of-plane multiplexing angle measured in a plane orthogonal to said plane of interaction, each hologram in said spot uniquely specified by the scan angle and out-of-plane multiplexing angle at which it was recorded, successive out-of-plane multiplexing angles differing by a difference angle sufficient to spatially separate reconstructions of holograms recorded in said recording spot at the same scan angle;

a detector plane facing said holographic recording medium; and a lens between said holographic recording medium and said detector plane, whereby to focus a reconstructed hologram previously recorded in said holographic recording medium onto said detector plane whenever said one beam is blocked; and wherein said out-of-plane multiplexing difference angle is sufficiently great so that holograms recorded in the same recording spot with reference beams at the same scan angle are reconstructed in separate locations near said detector plane.

28. The memory of claim 27 wherein:

said lens has a focal length $f$;

a reconstructed hologram near said detector plane has a beam diameter $d$; and said out-of-plane multiplexing difference angle is an angle $\Delta\alpha$ satisfying the following relationship:

$$d \leq f \times \Delta\alpha.$$

29. An optical memory, comprising:

a holographic recording medium capable of storing respective holograms in respective storage spots therein;

a coherent collimated light source of a reference beam and an object beam illuminating said recording medium;

a segmented optical array comprising a stack of plural segmented optical sub-arrays, each of said segmented optical sub-arrays comprising a column of generally parallel optical strips, wherein:

(a) each one of at least nearly all of the optical strips in a given one of said sub-arrays comprises a diffraction grating strip having diffraction grating lines extending parallel to the length of said strip transverse to said column of optical strips, (b) the diffraction grating lines in each strip has a line-to-line spacing providing a diffraction angle of a path of said reference beam to the corresponding one of said recording spots in said holographic recording medium, (c) each optical strip has a strip length extending parallel to said optical strips, respective optical strips of each sub-array providing an optical path for said reference beam to respective recording spots in said holographic recording medium whenever said reference beam is incident within said strip length;

reference beam steering means for scanning said reference beam to different locations on said segmented optical array; and modulator means for modulating said object beam with a succession of input patterns simultaneously with the scanning of said reference beam by said reference beam steering means so as to record a plurality of angle multiplexed in at least one of said recording spots.

30. The memory of claim 29 wherein each of said diffraction grating strips comprises a transparent material, and wherein the path of said reference beam to said holographic recording medium passes through said segmented optical array.

31. The memory of claim 29 wherein there is a monotonic increase in the number of diffraction grating lines per optical strip.

* * * * *